United States Patent [19]

Bird

[11] Patent Number: 5,721,422
[45] Date of Patent: Feb. 24, 1998

[54] ELECTRONIC DEVICES HAVING AN ARRAY WITH SHARED COLUMN CONDUCTORS

[75] Inventor: Neil C. Bird, Horley, England

[73] Assignee: U.S. Philips Corporation, New York, N.Y.

[21] Appl. No.: 615,923

[22] Filed: Mar. 14, 1996

[30] Foreign Application Priority Data

Mar. 16, 1995 [GB] United Kingdom ............... 9505305.4

[51] Int. Cl.$^6$ ................................................. H01J 40/14
[52] U.S. Cl. ................................. 250/208.1; 348/308
[58] Field of Search .......................... 250/208.1, 214.1, 250/214 LS, 208.2; 358/482–483; 348/307–309, 311, 294; 257/443–445

[56] References Cited

U.S. PATENT DOCUMENTS

| | | | |
|---|---|---|---|
| 4,948,966 | 8/1990 | Arques et al. | 250/208.1 |
| 5,193,018 | 3/1993 | Wu | 359/59 |
| 5,371,351 | 12/1994 | Van Berkel | 250/208.1 |

FOREIGN PATENT DOCUMENTS

| | | |
|---|---|---|
| 0471460A2 | 2/1992 | European Pat. Off. . |
| 059726A1 | 5/1994 | European Pat. Off. . |
| 2217891 | 11/1989 | United Kingdom . |
| 9404111 | 3/1994 | United Kingdom . |

Primary Examiner—Que Le
Attorney, Agent, or Firm—Steven R. Biren

[57] ABSTRACT

A flat panel display, image sensor memory device, or other type of large area electronic device, particularly but not exclusively with thin-film circuitry, includes an array of device elements (8) which are arranged in rows (N . . . ) and columns (M . . . ) with the device elements (8) in each pair of neighbouring columns (M, M+1) sharing a column conductor (11). The device elements (8) are coupled to their associated row conductor (21) via a first switching element (S1). In each pair (M, M+1) of neighbouring columns, the device elements (8) share a column conductor (11). Each device element of a row (n) in one column (M) of each pair is coupled via a respective second switching element (S2) to one reference conductor (1), while each device element (8) of the same row (N) in the other column (M+1) of the pair is coupled via a respective second switching element (S2) to another reference conductor (2). The reference conductors (1 and 2) function as enabling lines, which extend throughout the array for selecting their respective device elements (8). The device elements (8) in pairs of neighbouring columns share a column conductor (11), without the necessity for the device elements (8) to have opposite orientations, and without the need for the switching elements (S1, S2) to be of opposite conductivity types or to be driven with opposite polarity pulses.

11 Claims, 5 Drawing Sheets

ELECTRONIC DEVICES HAVING AN ARRAY WITH SHARED COLUMN CONDUCTORS

BACKGROUND OF THE INVENTION

This invention relates to electronic devices, particularly but not exclusively with thin-film circuitry, comprising an array of device elements which are arranged in rows and columns and which are coupled to both row and column conductors of the array. The device elements may be display elements of a flat panel display (for example a liquid crystal display), or image sensor elements (for example photosensitive diodes) of a large area image sensor, or several other types of device element (for example charge-storage elements of a data store or memory device, or temperature sensing elements of a thermal imaging device).

Published European Patent Application EP-A-0 597 226 discloses an electronic device comprising such an array. Each row of the device elements is addressable by voltages applied to the row conductors. In the particular form described in EP-A-0 597 226, the device elements are light emitting diodes (LEDs) of a display in order to reduce the number of external contact pads or connections, the array is arranged in pairs of neighbouring columns with each pair having a shared column connection. In order to operate with this shared column connection, the orientation of the device elements in alternate columns is reversed. In the device of EP-A-0 597 226, each column of device elements retains its own column conductor, and the shared column connections are formed by connecting pads at one end of these column conductors. The whole contents of EP-A-0 597 226 are hereby incorporated herein as reference material.

U.S. Pat. No. 5,193,018 (and in particular in FIGS. 8, 10, 11 and 12) illustrates an active matrix liquid crystal display comprising an array of display elements arranged in pairs of neighbouring columns. In each pair of neighbouring columns the display elements share a column conductor to which the display elements of both columns are coupled. Unlike a light emitting diode, the display elements of a liquid crystal display cannot per se be coupled with different orientations to the row conductors in order to permit sharing of column conductors. However, the device elements of each row are coupled to the associated row conductor via a switching element (a thin-film transistor in U.S. Pat. No. 5,193,018). In order to permit neighbouring columns to share a column conductor, these switching transistors of alternate columns are of opposite conductivity type. This requires the fabrication of both n-channel and p-channel transistors for the array, and the use of both positive and negative pulses on each row conductor. The whole contents of U.S. Pat. No. 5,193,018 are hereby incorporated herein as reference material.

The requirement for both polarities of voltage pulse (i.e. positive and negative) to be applied to each row conductor complicates the row driving circuitry for the array. Furthermore, it is not always convenient to fabricate both n-channel and p-channel transistors for the switching elements of an array of a large-area electronic device. The fabrication of these complementary transistors requires a large number of processing steps which may reduce the yield of fully working arrays fabricated in a manufacturing situation. Thus, in general, it is desirable to reduce the number of processing steps. The use of complementary transistors as switching elements permits the device elements of the array to share either column conductors or row conductors. Such an arrangement does not permit the device elements to share both column and row conductors in any one array.

Particularly with large-area arrays of compact high-resolution device elements of a display or of an imaging device, it is desirable to reduce both the number of column conductors and the number of row conductors. The number of connections to the row and column driver circuitry can then be reduced, and the number of multiple stages in the row and column drive circuitry may also be reduced. The row and column driver circuitry may then be accommodated more easily alongside the array.

SUMMARY OF THE INVENTION

It is an aim of the present invention to provide a device arrangement in which the device elements of an array in pairs of neighbouring columns share a column conductor (without the necessity for the device elements to have opposite orientations, and without the need for the switching elements to be of opposite conductivity types, and without the need to use drive pulses of opposite polarity) and more particularly to provide a device arrangement which permits the switching elements to be fabricated with less processing steps, and which may also allow the device elements of the array to share both a column conductor and a row conductor so as to reduce the numbers of both column conductors and row conductors for the array.

According to the present invention there is provided an electronic device comprising an array of device elements which are arranged in rows and columns and which are coupled to both row and column conductors, each row of the device elements being addressable by voltages applied to the row conductors, each device element of a row being coupled to the associated row conductor via a first switching element, the array being arranged in pairs of neighbouring columns, in each pair of which the device elements share a column conductor to which the device elements of both columns are coupled, characterized in that each device element of a row in one column of each pair is coupled via a respective second switching element to one reference conductor, each device element of the same row in the other column of the pair is coupled via a respective second switching element to another reference conductor, the first and second switching elements conduct when biased into an on-state by applied voltages, and the device comprises means for applying different reference voltages to the different reference conductors and for applying addressing voltages to the row conductors, for enabling only the switching elements associated with a selected row and with a selected column of each pair to conduct.

By thus coupling each device element via a respective second switching element to a different reference conductor dependent on the location of the device element in the array, the device elements can share column conductors without the necessity for the device elements to be of different orientations, and without the necessity for the switching elements to be of complementary conductivity types and without the necessity for opposite polarity drive pulses. The number of processing steps needed to fabricate the switching elements may be reduced, even when the switching elements are in the form of transistors. However, the present invention permits the switching elements to be formed as rectifying elements, for example thin-film diodes, which only require a small number of process steps for their fabrication. The layout of the device elements and their switching elements can also be simplified and may be standardised throughout the array. Furthermore, such an arrangement with second switching elements and different reference conductors permits the device elements to be arranged in groups of four with each group sharing a column conductor and sharing a row conductor. Thus, there can be a reduction in both the number of column conductors and the number of row conductors of the array.

Thus, the array may comprise device elements arranged in groups of four, each group comprising a pair of neighbouring columns which share a column conductor and a pair of neighbouring rows which share a row conductor. The four device elements of each group may comprise first and second device elements of one row and third and fourth device elements of the neighbouring row in the pair. The first and second device elements may be coupled via their respective second switching elements to respective first and second reference conductors. The third and fourth device elements may be coupled via their respective second switching elements to respective third and fourth reference conductors.

Because neighbouring columns share column conductors, the number of column conductors for the array is reduced and so the spacing of the column conductors across the array is increased. It is convenient to use the increased space between neighbouring column conductors in order to accommodate at least some of the reference conductors. Thus, at least some of the reference conductors may extend longitudinally across the array in spaces between neighbouring column conductors such that each pair of neighbouring column conductors is separated by a respective one of the reference conductors. When the device elements of the array share both column conductors and row conductors and have first, second, third and fourth reference conductors, two of these reference conductors (e.g. the second and third reference conductors) may extend longitudinally across the array in spaces between neighbouring column conductors such that each pair of neighbouring column conductors is separated by a respective one of these two reference conductors, and the other two reference conductors may extend longitudinally across the array in spaces between neighbouring row conductors such that each pair of neighbouring row conductors is separated by at least one (and possibly by both) of these other two reference conductors.

The switching elements may be formed using various known device technologies. In the case of thin-film circuitry, the first and second switching elements may comprise thin-film transistors and/or thin-film diodes. In the case of thin-film transistors, the device elements of the array may be coupled to their shared column conductors by at least the second transistor (possibly by both the first and second transistors), and the reference conductor may be coupled to a gate of the second transistor. The associated row conductor may be coupled to a gate of the first transistor. The voltages so applied to the gates of these transistors control the conduction states of the transistors. All the first and second transistors of the array may be of the same conductivity type e.g. n-channel transistors.

Instead of using transistor technology, the first and second switching elements may be rectifying elements which allow the passage of current when forward biased by applied voltages. Such rectifying elements (for example thin-film diodes) may be fabricated in less processing steps than transistors. The device element may be coupled between its shared column conductor and a node between the first and second rectifying elements. All these rectifying elements of the array may have the same orientation in their respective coupling from the device elements to their associated row conductor or reference conductor.

BRIEF DESCRIPTION OF THE DRAWINGS

These and other features of the present invention, and their advantages, are illustrated specifically in embodiments of the invention now to be described, by way of example, with reference to the accompanying diagrammatic drawings, in which.

Figure 1:
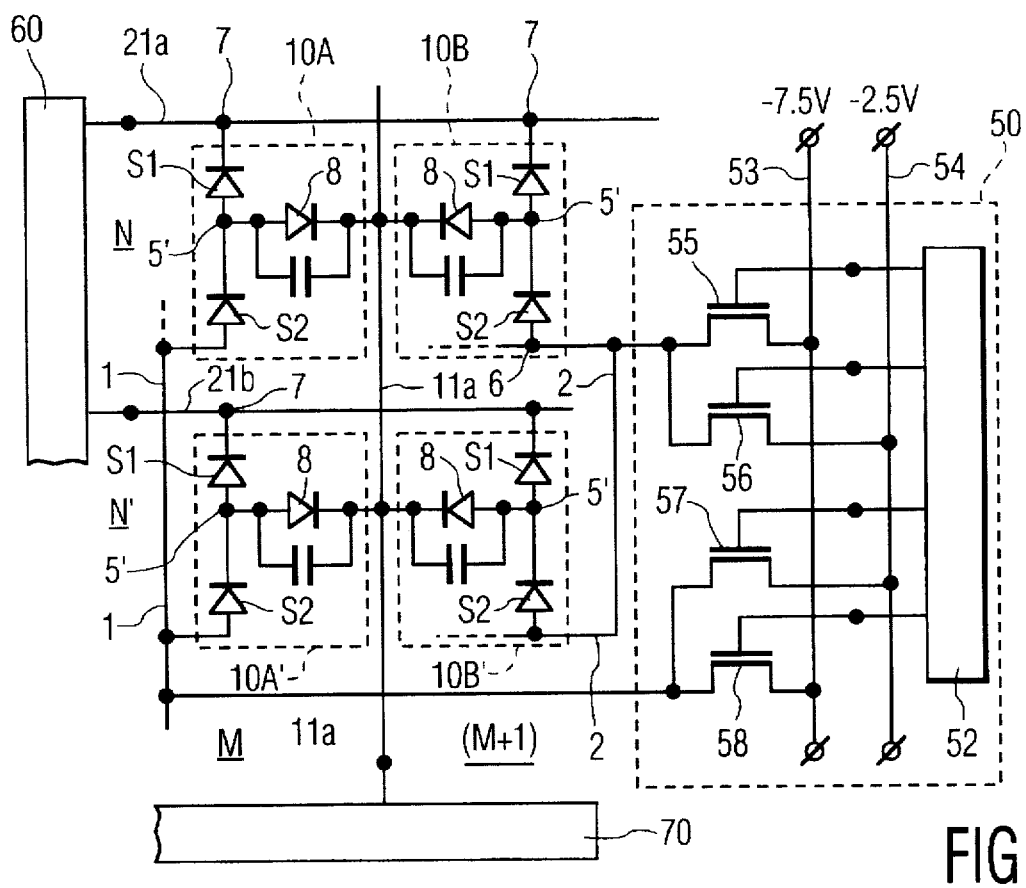
FIG. 1 is a simple circuit diagram of four pixels which form part of a much larger array of device elements, and its drive circuitry in an electronic device in accordance with the present invention.

It should be noted that all the drawings are diagrammatic and not drawn to scale. Relative dimensions and proportions of parts of these Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

The electronic device, part of which is shown in FIG. 1, comprises device elements 8 which are arranged in rows N, N', ... and columns M, (M+1), ... of an array and which are coupled to both row and column conductors 21 and 11 respectively of the array. Each row N, N'. .. of the device elements 8 is addressable by voltages applied to the row conductors 21. In a particular embodiment, the device elements 8 may be photosensitive elements of an image sensor device. The image sensor device has an array of pixels 10, each pixel 10 comprising one such photosensitive element 8. The row conductors 21 are scan lines for scanning the pixels of the sensor array on a row by row basis, using voltage pulses applied in known manner from a row driver circuit 60. The column conductors 11 are data lines for carrying data from the sensing elements 8 of the selected pixels 10 to be read in known manner in an output circuit 70. The sensing elements 8 illustrated in FIG. 1 are photosensitive diodes which include an inherent capacitance (represented by a capacitor symbol in the drawing) associated with the diode junction. By means of this capacitance the photosensing element 8 is able (in one mode of operation) to store charge in response to light incident on the element 8.

Figure 7:
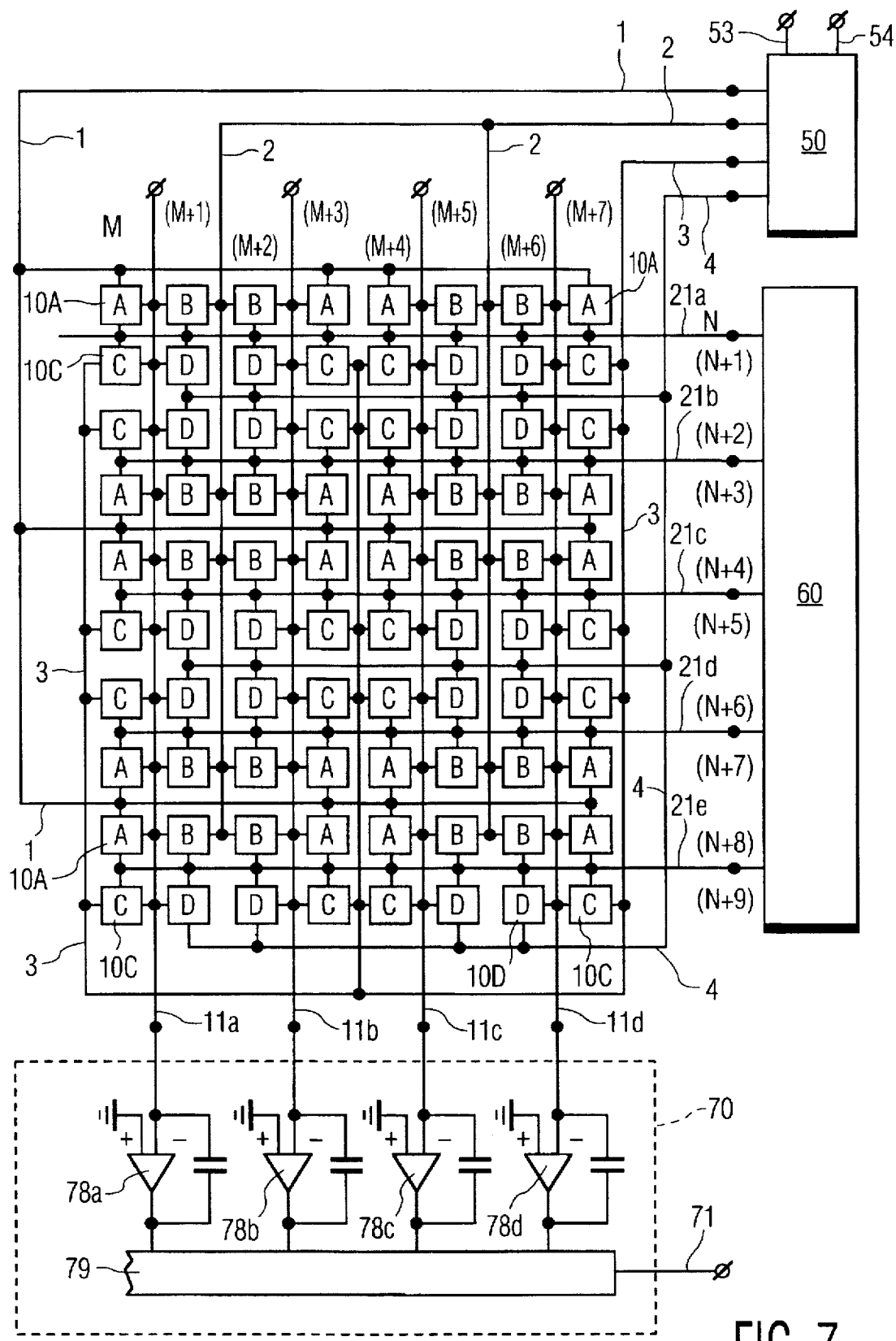
FIG. 7 is an overall plan view of an array of an electronic device in accordance with the present invention, illustrating one possible layout of its row and column conductors and reference conductors, and its drive circuitry.

FIG. 1 shows only four pixels 10A, 10B, 10A', 10B' of the array. The pixels 10A and 10B are in one row N, and their device elements 8 are coupled to the associated row conductor 21a via a first switching element S1. The pixels 10A' and 10B' are in another row N', and their device elements 8 are coupled to the associated row conductor 21b via a first switching element S1. The array is arranged in pairs of neighbouring columns, of which only two such columns M and (M+1) are shown in FIG. 1. In each pair of neighbouring columns, the device elements of pixels 10A, 10B, 10A' and 10B' share a column conductor 11 (11a in the example of FIG. 1) to which the device elements 8 of both columns M and (M+1) are coupled. FIG. 1 shows only one pair of neighbouring columns, whereas several such pairs of neighbouring columns M to (M+7) are illustrated in FIG. 7. A large area image-sensor (or a display) will have hundreds of such columns and rows.

The present invention permits device elements 8 which are coupled to the same shared column conductor 11 to be separately selected even where these elements 8 are in the same row. Thus, each device element 8 of a row N, (or N', or . . . ) in one column (e.g. column M) of each pair M, (M+1) is coupled via a respective second switching element S2 to one reference conductor 1. Each device element 8 of the same row N, (or N', or . . . ) in the other column (M+1) of the pair is coupled via a respective second switching element S2 to another reference conductor 2. The reference conductors 1 and 2 function as enabling lines which extend throughout the array for coupling to their respective switching elements. The first and second switching elements S1 and S2 conduct when biased into an on-state by applied voltages. Thus, for example, the switching elements S1 and S2 are rectifying elements in the embodiments shown in FIGS. 1 and 3. The device element 8 (i.e. a photodiode in FIG. 1) is coupled between the shared column conductor 11 and a node 5' between the rectifying elements S1 and S2. These rectifying elements allow the passage of current when they are forward-biased by voltages applied on the conductors 1, 2 and 21. They block the passage of current when reverse-biased by the voltages on these conductors 1, 2 and 21.

Thus, these rectifying elements S1 and S2 are reverse-biased in this manner during the photodiode integration period (when the recharged capacitance of a photodiode 8 is allowed to discharge progressively by photogeneration of charge during illumination). The change in charge state of the photodiode 8 at the end of its integration period is read out on the column conductor 11 when its associated rectifying elements are forward-biased to recharge the capacitance of the photodiode 8.

Figure 2:
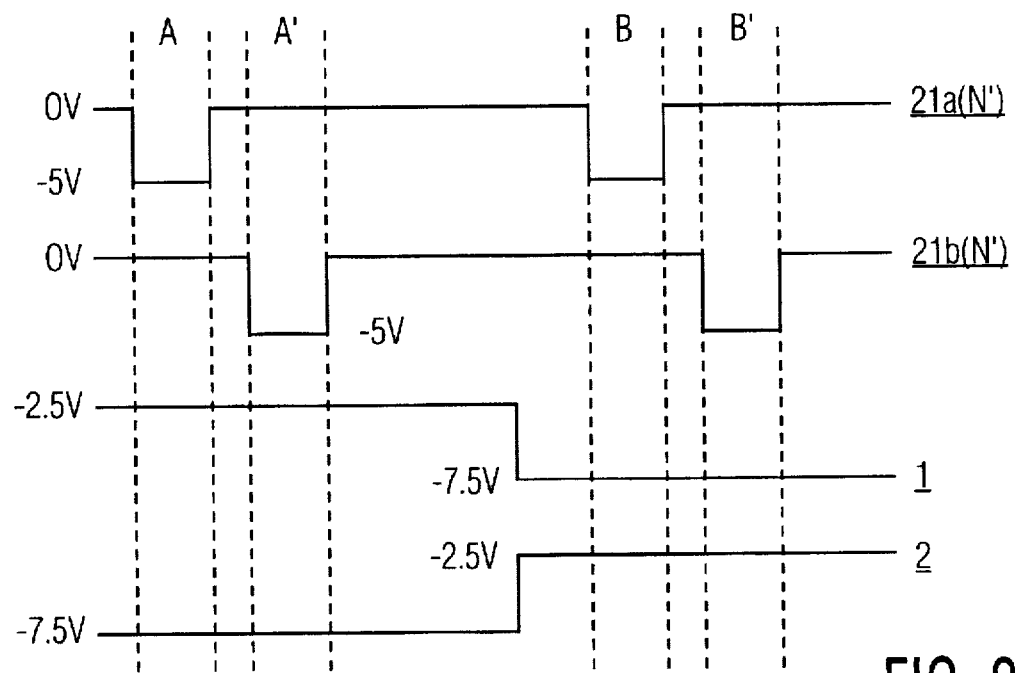
FIG. 2 are plots illustrating the voltages applied to the row conductors and reference conductors of the pixels of the device of FIG. 1.

FIG. 2 illustrates in time sequence the application of such voltages to the conductors 1, 2, 21a and 21b of FIG. 1, and also illustrates when the pixels 10A, 10A', 10B, 10B' are read out on the shared column conductor 11a. The voltage values given in FIG. 2 (namely 0V, −5V, −2.5V, −7.5V) are specific examples of voltages appropriate for biasing particular embodiments of the sensing elements 8 and rectifying elements S1 and S2 in the form of thin-film diodes as fabricated by a thin-film circuit technology suitable for forming a large-area image sensor array and/or addressing array of liquid-crystal display. In this specific example, a pulse of −5V is applied sequentially to the row conductors 21 to address sequentially each row N, N', . . . of the device elements 8. These row voltage pulses are applied to the row conductors 21 in known manner by a row driving circuit 60 of known type. This row driving circuit may comprise a shift register and decoder circuit controlling (via clock signals) the switching of transistor switches on each row conductor 21. The voltage pulses applied to the reference conductors 1 and 2 are of longer duration than the row voltage pulses, and their voltage levels are switched between −2.5 volts and −7.5 volts. These reference voltage pulses may be applied from a −7.5 volt supply line 53 and a −2.5 volt supply line 54 of a voltage pulse generator 50. The supply lines 53 and 54 are connected to the reference conductors 1 and 2 via transistor switches 55 and 56 for the conductor 2 and transistor switches 57 and 58 for the conductor 1. The switching of the transistors 55 to 58 is controlled by clock signals from a timing circuit 52 of the pulse generator 50.

FIG. 2 illustrates the time sequence of these pulses for a sequential read out of the pixels 10A, 10A', 10B, 10B'. In the time interval A, the −5 volt row pulse is applied to only the row conductor 21a of the row N. The other rows N', . . . are therefore not addressed at this time. Both pixels 10A and 10B are connected to the row conductor 21a. However, the reference conductor 2 coupled to the pixel 10B is biased at a more negative voltage (−7.5V) than the row pulse (−5V). Thus the rectifying elements S1 and S2 of pixel 10B are reverse biased and so block the passage of current. The reference conductor 1 of pixel 10A is biased to a less negative voltage (−2.5V) than the row pulse (−5V). Thus, in interval A, the rectifying elements S1 and S2 of pixel 10A are forward biased and so the capacitance of photodiode 8 of pixel 10A is recharged and its residual charge read out via the shared column conductor 11a.

In the time interval A', the row N' is addressed by the row pulse (−5V) from the row driver circuit 60. Reference conductor 1 is still at a less negative voltage (−2.5V) and so the rectifying elements S1 and S2 of pixel of 10A' are forward biased thus re-charging the associated photodiode 8 and reading out its charge state on the column conductor 11a. In this time interval A', the pixel 10B' which is also connected to the row conductor 21b of row N' has its reference conductor 2 at a more negative bias (−7.5V) as compared with the row pulse (−5V). Thus, the rectifying elements S1 and S2 of pixel 10B' remain reverse-biased.

In the time interval B, the row pulse is again applied to row conductor 21a of row N. However, at this time the reference conductor 1 is at a more negative bias (−7.5V) than the row pulse (−5V), and so the rectifying elements S1 and S2 of pixel 10A remain reverse-biased. The reference conductor 2 is at a less negative bias (−2.5V) than the row pulse (−5V), and so the rectifying elements S1 and S2 of pixel 10B are forward-biased. Thus in the interval B, the photodiode 8 of pixel 10B is read out and re-charged.

In the time interval B', the row pulse is again applied to row conductor 21b of row N'. The reference conductor 1 is at a more negative voltage (7.5V) as compared with the row pulse (−5V), and so the rectifying elements S1 and S2 of pixel 10A' are reverse biased. However, the reference conductor 2 of pixel 10B' is at a less negative potential (−2.5V), and so the rectifying elements S1 and S2 of pixel 10B' are forward biased to permit reading and recharging of the photodiode 8 of pixel 10B'.

Thus, the present invention permits the photodiodes 8 which are coupled to the same shared column conductor 11a to be separately selected even where these photodiodes 8 are in the same row (N, or N', or . . . ). Therefore, the number of column conductors 11 required for an array can be reduced. Thus, the number of inputs to the column drive circuitry 70 can be reduced. The spacing between the column conductors 11 may therefore be increased and/or an increased number of smaller (higher resolution) pixels can be arranged between the column conductors 11. As illustrated in the drawings, these advantages can be obtained with all the device elements 8 of the array having the same orientation in their coupling to the shared column conductors 11, all the first rectifying elements S1 having the same orientation in their coupling to the row conductors 21, and all the second rectifying elements S2 having the same orientation in their coupling to their respective reference conductors 1, 2, . . . .

Figure 3:
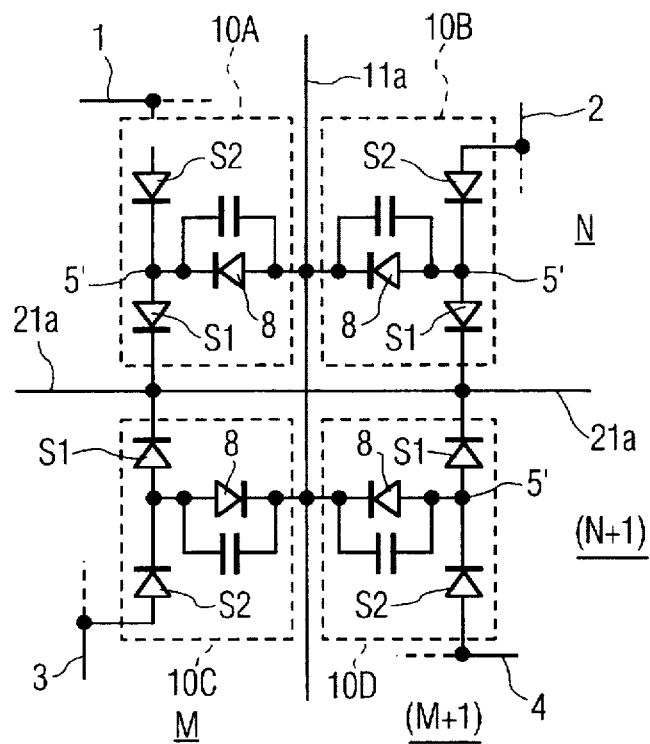
FIG. 3 is a simple circuit diagram of a group of four pixels arranged in an array in accordance with the present invention.
Figure 4:
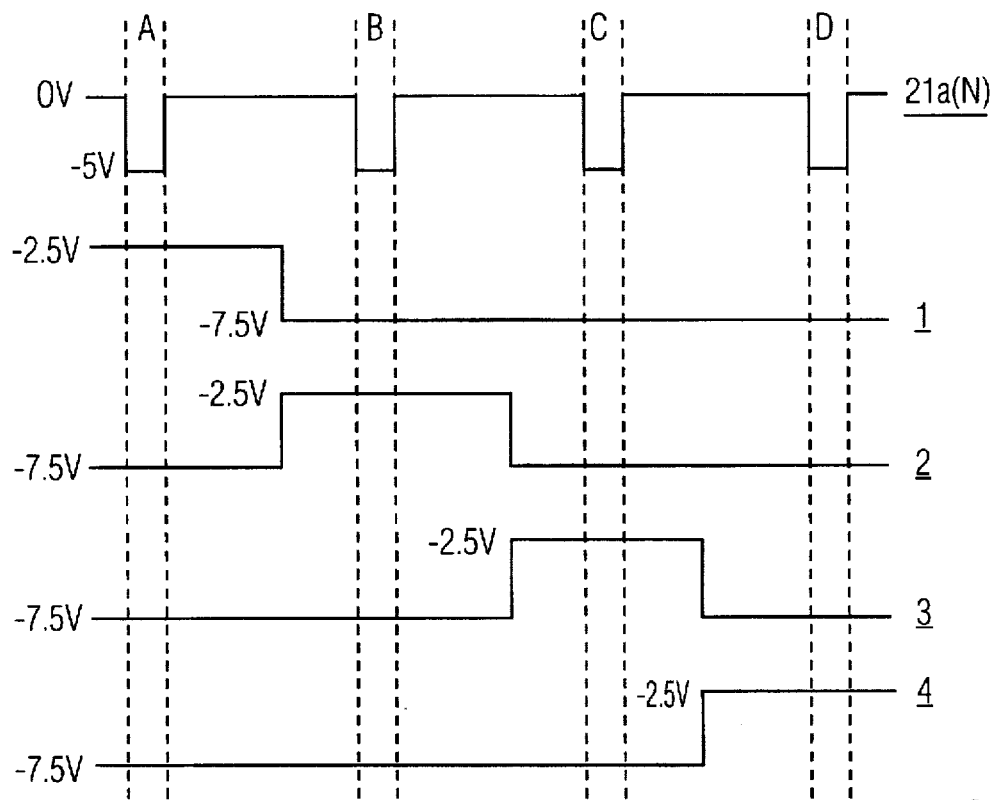
FIG. 4 is a plot of voltages applied to the row conductor and reference conductors in the operation of the device of FIG. 3.

Furthermore, as illustrated in the modification of FIGS. 3 and 4, the present invention permits the device elements 8 of an array to share a row conductor 21 as well as sharing a column conductor 11. Thus, there can be a reduction in both the number of column conductors 11 and the number of row conductors 21.

In the modification of FIGS. 3 and 4, the pixels 10 of the array are arranged in groups of four with each group sharing a column conductor 11 and sharing a row conductor 21. FIG. 3 illustrates only one such group which shares the column conductor 11a and the row conductor 21a and which comprises the four pixels 10A, 10B, 10C and 10D. Pixels 10A and 10B are in row N, whereas pixels 10C and 10D are in row (N+1). Pixels 10A and 10C are in column M, whereas pixels 10B and 10D are in column (M+1). Each of the pixels 10A, 10B, 10C and 10D has a respective reference conductor 1, 2, 3 and 4. FIG. 4 illustrates the voltage pulses applied to these conductors 21a, 1, 2, 3 and 4 to read out and re-charge the pixel 10A in time interval A, the pixel 10B in time interval B, pixel 10C in time interval C and the pixel 10D in time interval D. The mode of operation (in terms of forward-biasing and reverse-biasing their associated rectifying elements S1 and S2) is the same as for the pixels of FIG. 2.

FIG. 7 illustrates how such a group of 4 pixels 10A, 10B, 10C, 10D can be repeated throughout an array. For the sake of convenience and clarity in the drawing, the individual pixels 10 are simply labelled with their respective letters A, B, C and D in FIG. 7. In each pair of neighbouring rows of the array, the pixels A and B are in one row whereas the pixels C and D are in the neighbouring row. In each pair of neighbouring columns of the array, the pixels A and C are in one column, whereas the pixels B and D are in the neighbouring column. Row N of FIG. 7 is equivalent to row N of FIG. 1, and row (N+3) of FIG. 7 is equivalent to row N' of FIG. 1. All the pixels 10A share a common reference conductor 1. All the pixels 10B share a common reference conductor 2. All the pixels 10C share a common reference conductor 3. All the pixels 10D share a common reference conductor 4.

As illustrated in FIG. 7, two of these reference conductors 1 to 4 may extend longitudinally across the array in spaces between neighbouring column conductors 11, while the other two of the reference conductors 1 to 4 extend longitudinally across the array in spaces between neighbouring row conductors 21. Thus, in the embodiment of FIG. 7, the second and third reference conductors 2 and 3 extend parallel to the column conductors 11 such that each pair of neighbouring column conductors 11 is separated by a respective one of the second and third reference conductors 2 and 3. The first and fourth reference conductors 1 and 4 extend parallel to the row conductors 21 such that each pair of neighbouring row conductors 21 is separated by one of the first and fourth reference conductors 1 and 4. The four reference conductors 1 to 4 are connected to the pulse generator 50 having its voltage supply lines 53 and 54. Each reference conductor 1 to 4 is coupled to the supply lines 53 and 54 by respective switching transistors (such as transistors 55 and 56 for conductor 2, and transistors 57 and 58 for conductor 1, as illustrated in FIG. 1).

The column read out circuit 70 may be of known type, for example comprising charge-sensitive amplifiers 78 coupled to an output shift register and decoder circuit 79. When the charge state of the photodiode 8 of a pixel 10 is read out, the current that flows on the column conductor 11 is integrated by the associated charge-sensitive amplifier 78 for that conductor 11. The column conductor 11 is connected to the negative input of the charge-sensitive amplifier 78. Each charge-sensitive amplifier 78 (having its output coupled to its negative input via a capacitor) serves to convert the current supplied from the column conductor 11 into a voltage output. These voltage outputs from the charge-sensitive amplifiers 78 are fed to the output shift register and decoder circuit 79 from which image signals may be supplied by an output 71 to an appropriate store or to a display (neither of which is shown). The positive inputs of the charge-sensitive amplifiers 78 are coupled to ground or to any suitable fixed reference potential, the value of which is effectively determined by the row voltages (−5V in the examples of FIGS. 2 and 4) because the photosensitive diodes 8 must always be reverse-biased.

Figure 5:
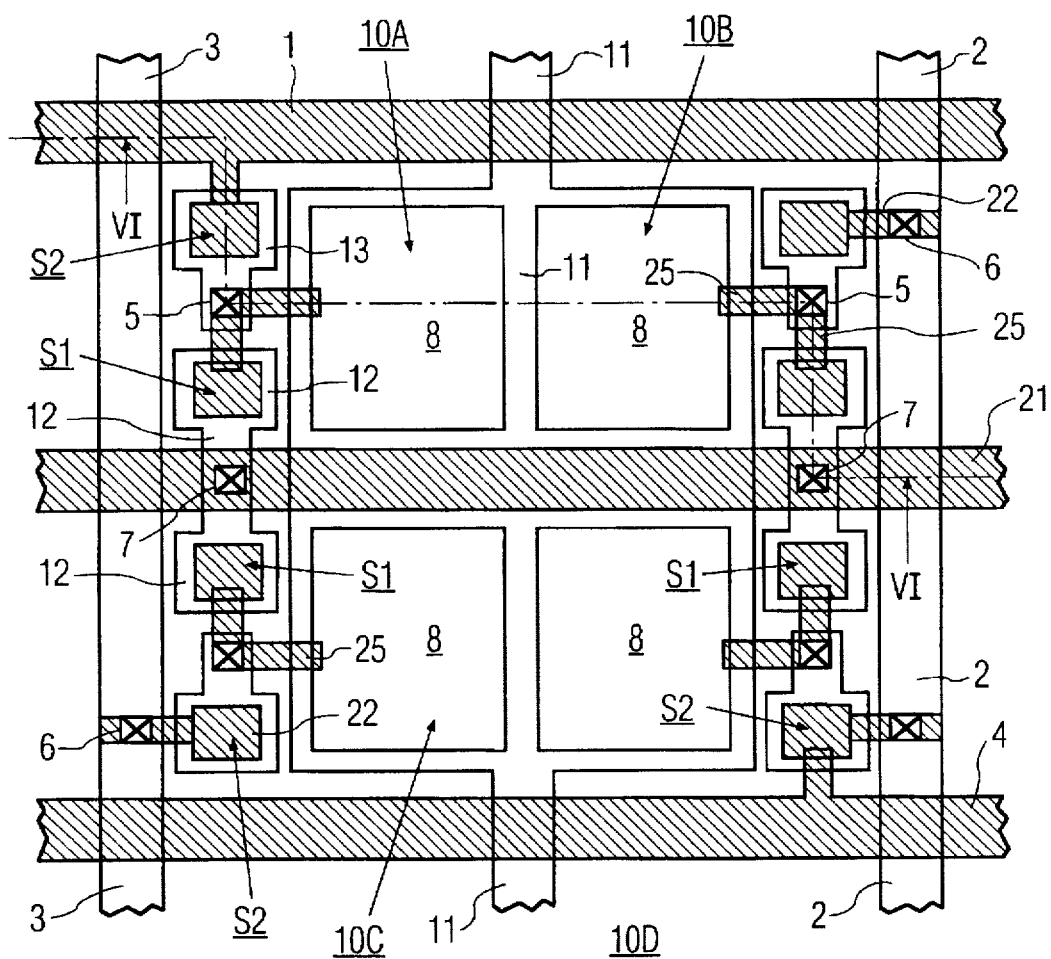
FIG. 5 is a plan view of part of an image sensor device embodying such a pixel arrangement in accordance with the present invention and illustrating one possible layout.
Figure 6:
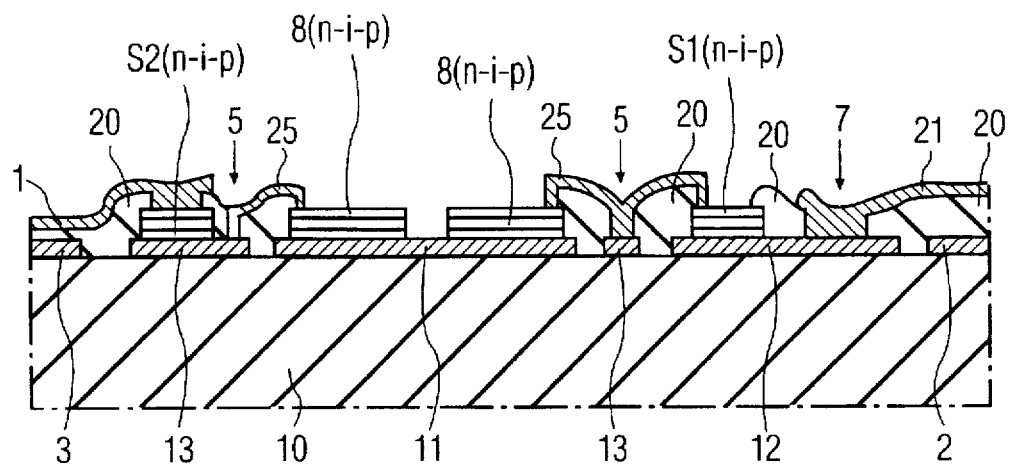
FIG. 6 is a cross-sectional view taken along the line VI—VI in FIG. 5.

FIGS. 5 and 6 illustrate a specific example of the integration of the pixels 10A, 10B, 10C and 10D of the image sensor of FIGS. 3 and 7, using a particular thin-film diode technology. The image sensor array is formed using this thin-film diode technology on an insulative, generally transparent, substrate which may be formed of a suitable glass or plastics material. The peripheral circuitry 50, 60 and 70 may be formed in separate silicon chips using monolithic silicon integrated circuit technology. These separate circuit chips may then be mounted on the insulative substrate 10 or they may be mounted on a separate circuit board electrically connected to the conductor tracks on the substrate 10.

In a specific example of a suitable thin-film diode technology, a first electrically conductive film (generally a chromium layer) is deposited onto the insulating substrate 10 and defined to form at least part of the column conductors 11, the reference conductors 2 and 3, cathode electrodes 12 of the rectifying elements S1, and cathode electrodes 13 of the rectifying elements S2. As illustrated in FIGS. 5 and 6, the cathode electrode of each photosensitive diode 8 may be formed by an expanded area of the column conductor 11. This expanded area of the column conductor 11 also forms a light shield over the whole bottom surface of the photodiodes 8.

The photosensitive diodes 8 and the switching diodes S1 and S2 may be formed from the same semiconductor material. Thus, each of these diodes 8, S1 and S2 may be an amorphous silicon n-i-p diode, all the diodes being formed simultaneously by depositing in sequence amorphous silicon films of n-type conductivity, intrinsic conductivity, and p-type conductivity. These silicon films are then patterned into separate islands to define the diode structures as shown in FIGS. 5 and 6.

An insulating film (generally a silicon nitride layer) is then deposited and patterned to define dielectric isolation regions 20. A second electrically conductive film (generally a chromium and/or aluminium layer) is then deposited and patterned to define the row conductors 21, the reference conductors 1 and 4, and interconnects 22 and 25. This second conductive film pattern is hatched in FIG. 5, for clarity in the understanding of the drawing. Where the rectifying elements S2 are connected to the reference conductors 1 and 4, there is a local expansion of the reference conductor 1 or 4 in order to form the anode electrode of the diode S2. The interconnects 22 form the anode electrodes of the diodes S2 and extend over the reference conductors 2 and 3, to which they are connected through a via window 6 in the dielectric film 20. Electrical connections between the cathode electrodes 12 of the rectifying elements S1 and the row conductors 21 are formed by the row conductor 21 contacting the underlying electrode 12 in a via window 7 of the dielectric film 20. The interconnects 25 contact the p-type silicon film of the diodes 8 and S1 to form the anode electrodes of these diodes. The interconnect 25 contacts the cathode electrode 13 of the rectifying elements S2 at a via window 5 in the dielectric layer 20, where the interconnect 25 then forms the node 5' of the circuit configuration of the elements S1, S2 and 8. The cross-sectional view of FIG. 6 is taken through the via windows 7 and 5. Although not shown in the drawings, a protective transparent insulating layer (such as a layer of polyimide) may be deposited over the structure.

The layout of the image sensor may have any appropriate pattern. In the example shown in FIG. 5, the conductors 1, 2, 3, 4, 11, 12 define a rectangular (generally square) grid with the photosensitive diodes 8 occupying most of the area of their respective pixels 10. However, the photodiodes 8 (and their cathode electrodes 11) may be confined to one or more edges of their respective pixel 10 so as to allow the image sensor to be as transparent as possible. Such a transparent image sensor may then be placed on top of something else, such as a display, without significantly obscuring the display. However, where maximum photosensitivity is required (for example, for x-ray diagnostic imaging equipment), then the areas of the photosensitive diodes 8 should be as large as possible.

To the extent that neighbouring rows of the image sensor of FIGS. 5 to 7 share a common row conductor 21, this sensor has certain similarities to that disclosed in pending United Kingdom Patent Application No 9404111.8 having United Kingdom priority date of 3rd Mar. 1994 and corresponding to U.S. Pat. No. 5,572,015. However, the arrangement of United Kingdom Patent Application 9404111.8 does not permit the sharing of column conductors between neighbouring columns of the array. Furthermore, it is necessary in the sensor array of United Kingdom Patent Application 9404111.8 for the rectifying elements of pixels associated with one shared row conductor to be oppositely orientated with respect to the rectifying elements of the pixels associated with the neighbouring shared row conductors. The photodiodes coupled to these associated neighbouring row conductors are also oppositely orientated. The need for opposite orientation complicates the layout of the rectifying elements and photodiodes and the organisation of their pixels, as can be seen by comparing the present FIGS. 5 and 6 with FIGS. 4 to 6 of United Kingdom Patent Application 9404111.8. Furthermore, this opposite diode orientation arrangement illustrated in United Kingdom Patent Application 9404111.8 requires the application of both positive and negative pulses to the row conductors, so requiring a more complex row driver circuit than that required in accordance with the present invention. Most importantly, the present invention permits the sharing of both row conductors 21 and column conductors 11. Thus, the number of row and column conductors 21 and 11 can be reduced, their spacing can be increased and/or the resolution of the pixels can be increased, and the connection and multiplexing of the row and column driver circuitry 60 and 70 to the array can be reduced.

As described in United Kingdom Patent Application 9404111.8, it can be advantageous for one of the rectifying elements S1 and S2 to be photosensitive in order to reduce vertical cross-talk between the pixels 10. Thus, some vertical cross-talk may arise from unwanted currents flowing down the column conductors 11 from unselected pixels 10 when a selected pixel coupled to the same column conductor 11 is being read out. The result of such vertical crosstalk is that the integrated output from the charge-sensitive amplifier 78 for the selected pixel 10 may include contributions from all of the other pixels 10 coupled to that column conductor 11. The main source of the unwanted column currents is "dynamic leakage" from the unselected pixels in that column. Thus, when a pixel 10 is sensing light, the intrinsic capacitance of its photosensitive diode 8 is being discharged by the photo-generation of charge carriers within the photosensitive diode 8, which in turn means that the voltage across the rectifying element S1 is changing. The changing voltage $V_x$ at the node 5 between the two rectifying elements S1 and S2 causes a current I to flow through the capacitance $C_D$ of the rectifying element S1. This current I is given by the expression $$I = C_D \frac{dV_x}{dt} \quad \text{Equation 1}$$

This current I flows down the associated column conductor 11 so causing vertical cross-talk. The effect of this cross-talk is that information may be removed from an image such as, for example, black text on a white background could appear white and so be lost in the background.

In the device array of FIGS. 1 or 3 or 5 and 6, all the device elements 8 and the rectifying elements S1 and S2 comprise junction diodes. In order to eliminate, or at least substantially reduce such vertical cross-talk the rectifying element S1 (i.e. the rectifying diode which is of opposite orientation to the photodiode 8) is made photosensitive. Thus, in the array layout of FIGS. 5 and 6, the interconnect 25 which forms the anode electrodes to the photodiode 8 and to the rectifying element S1 is made transparent over the upper face of both these elements 8 and S1. This transparency to the light to be detected may be most simply achieved by cutting back the area of the interconnect 25 so that it does not extend across the whole of the upper face of the elements 8 and S1. Such a cut-back is illustrated in FIGS. 5 and 6. Due to the cutback of their anode electrodes 25, the photosensitive diodes 8 and S1 are exposed to incident light on their anode side.

As described in United Kingdom Patent Application 9404111.8, the condition for zero or minimum leakage current flowing down the column conductor 11 from an unselected pixel connected to that same column conductor 11 is given by the expression:

$$\frac{I_P}{C_P} = \frac{I_D}{C_X + C_Y} \quad \text{Equation 2}$$

In this expression $I_p$ and $C_p$ relate to the photosensitive diode 8 which is represented as a source of current $I_p$ in parallel with a capacitance $C_p$. The photosensitive rectifying element S1 is represented as a source of current $I_D$ in parallel with a capacitance $C_x$. The non-photosensitive rectifying element S2 is represented simply as a capacitance $C_y$ in parallel with the capacitance $C_x$.

Thus, $C_x$, $C_y$ and $C_p$ are the intrinsic capacitances of the photosensitive rectifying element S1, the other rectifying element S2 and the photosensitive device element 8, respectively, and $I_p$ and $I_D$ are the currents generated by light incident on the photosensitive device element 8 and the photosensitive rectifying element S1. Adopting the arrangement of Equation 2 reduces leakage current from a device element 8 during the reading out of charge from another device element 8 coupled to the same column row 11.

The photosensitive current $I_{PHOTO}$ of a photodiode is equal to $KA_{CON}$ where K is a constant and $A_{CON}$ is the area of the photodiode which is exposed to light (normally this area is the area of the hole in the opaque electrode 25 of the photodiode as shown in FIG. 5). Accordingly, the condition for no leakage current can be defined by the geometry of the photosensitive diodes 8 and S1. If it is assumed that the rectifying elements S1 and S2 are of equal area and the thickness of all three diodes S1, S2 and 8 is the same, then, in terms of this geometry, Equation 2 becomes:

$$\left( \frac{A_{CD1}}{2A_{DD1}} \right) = \left( \frac{A_{C3}}{A_{D3}} \right) \quad \text{Equation 3}$$

where $A_{DD1}$ and $A_{D3}$ are the actual areas of the rectifying element S1 and the photosensitive diode 8 respectively, and are thus proportional to their capacitance.

While $A_{CD1}$ and $A_{C3}$ are the smaller areas of the rectifying element S1 and the photosensitive diode 8, respectively, actually exposed to incident light and so are proportional to the photocurrent generated by the light incident thereon.

As used herein, the term "area" in relation to the diodes S1, S2 and 8 means the area of the diode in a plane generally parallel to the diode electrodes, that is, in relation to FIGS. 5 and 6 in a plane parallel to the surface of the substrate 10 upon which the diodes are formed. The thicknesses of the diodes are measured in a direction perpendicular to the surface of the substrate 10.

Accordingly, by appropriately selecting the relative geometries of the diodes S1, S2 and 8, the leakage current from an unselected pixel (coupled to the same column conductor 11 as a selected pixel) will flow internally within the capacitance/photocurrent loop of the diode S1 of that unselected pixel and not through the column conductor 11. By this means the vertical cross-talk can be eliminated or at least substantially reduced.

Thus, in an electronic device in accordance with the present invention, it is advantageous for the switching elements and the device elements both to comprise junction diodes. The number of processing steps for fabricating both the switching elements and the device elements can be reduced in this case, so permitting an improvement in manufacturing yield. Furthermore, one of the junction-diode switching elements and be made photosensitive to the incident light to reduce vertical cross-talk on the shared column conductors.

Figure 9:
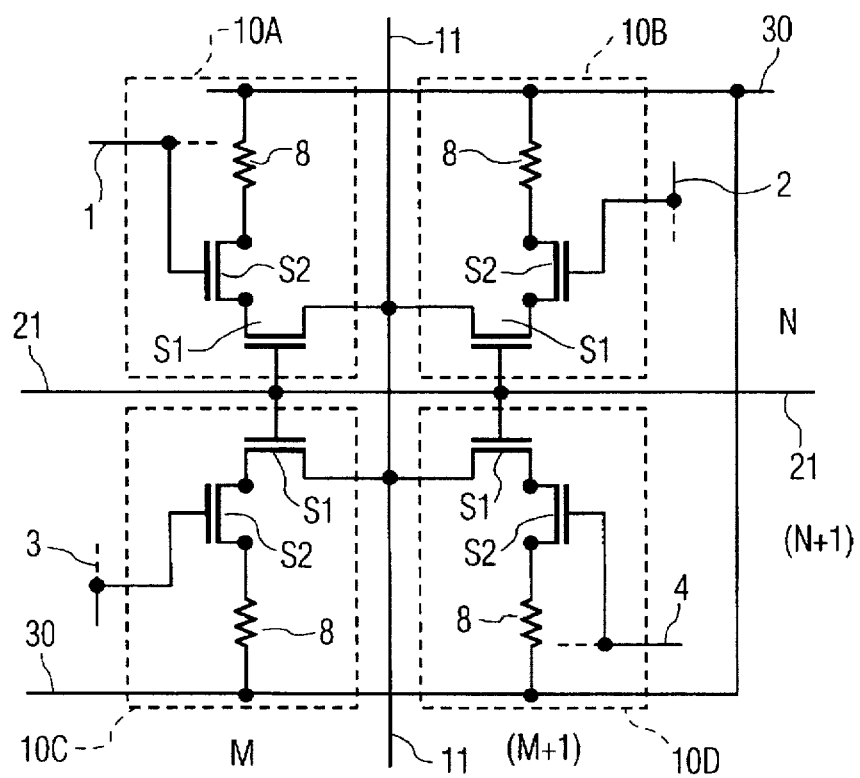
FIG. 9 is a simple circuit diagram of four pixels forming part of a much larger array of an electronic device in accordance with the present invention and having a different type of switching element as compared with the four-pixel circuit of FIG. 5.

However, the switching elements of pixels of a device in accordance with the present invention need not be junction diodes and need not be rectifying elements. Thus, FIG. 9 illustrates an embodiment in which the first and second switching elements S1 and S2 comprise thin-film transistors. The device element 8 of each pixel 10 is coupled to its shared column conductor 11 by at least the second transistor S2, a gate of which is coupled to one of the reference conductors 1, 2, 3, 4. The opposite terminal of the device element 8 is coupled to a common bias line 30 which extends throughout the array. FIG. 9 illustrates a group of four pixels 10A, 10B, 10C, 10D which share a common row conductor 21 as well as a common column conductor 11. Thus, the pixel arrangement is comparable to that of the group of four pixels 10A, 10B, 10C, 10D of FIGS. 3 and 7. All the transistors S1 and S2 of the array may be of the same conductivity type, for example n-channel transistors.

In the particular example of FIG. 9, the device element 8 is coupled to its shared column conductor 11 by both the first and second transistors S1 and S2, and the associated row conductor 21 is coupled to a gate of the first transistor S1. In this situation, the row pulse applied to the gate of the transistor S1 will switch on the transistor S1, but no current will flow through this transistor S1 unless its associated second transistor S2 is also turned on by the reference voltage applied on its conductor 1, 2, 3, or 4.

The transistors S1 and S2 of each pixel of FIG. 9 are connected in series. These series connected transistors S1 and S2 together couple the device element 8 to its column conductor 11 and (via the gate of S1) to its row conductor 11. However, an alternative embodiment is possible in which the device element 8 is coupled to its column conductor 11 by only one transistor S2. The device element 8 is coupled to its row conductor 21 by a transistor S1. The device element 8 may be coupled to a node between the two switching transistors S1 and S2.

Figure 8:
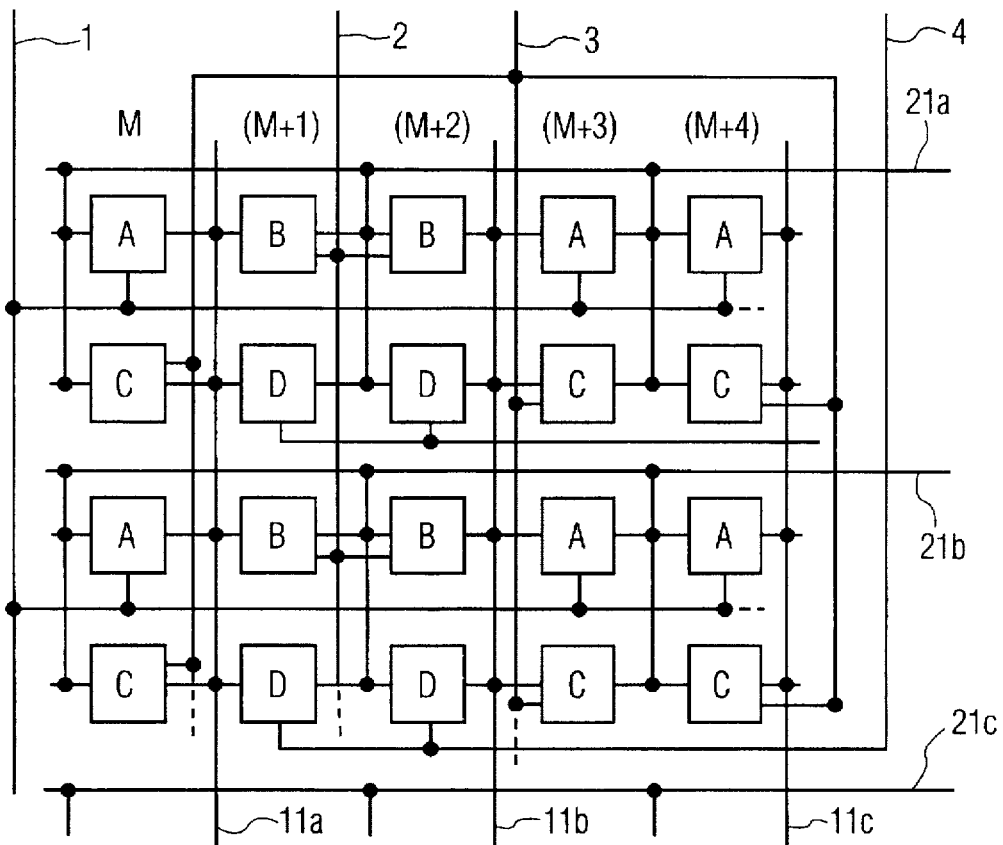
FIG. 8 is an overall plan view of part of the device of FIG. 7, illustrating a modification in the arrangement of the reference conductors.

FIG. 7 illustrates a particularly convenient layout for the conductors of the array, in which only one of the reference conductors 1, 2, 3 or 4 is present between each pair of shared column conductors 11 and each pair of shared row conductors 21. However, other arrangements are possible. Thus, for example, FIG. 8 illustrates an arrangement in which two reference conductors 1 and 4 are present between each pair of shared row conductors 21. This FIG. 8 arrangement may be adopted with the four-pixel group array arrangement of FIG. 3 having four common lines 1 to 4. The FIG. 8 arrangement may also be adopted with the four-pixel group array arrangement of FIG. 9 having five common lines 1 to 4 and 30. In this latter case, the common bias line 30 for the photosensitive device elements 8 may be present between the alternate pairs of shared column conductors 11 (e.g conductors 11b and 11c in FIG. 8) which do not have any reference conductor 1 to 4 therebetween.

Although an image sensor has been described so far with reference to FIGS. 1 to 9, the electronic device may be of a different type, for example a display device. In this case, the device elements 8 may be pixel elements of a liquid-crystal display. The row conductors 21 are scan-lines for addressing rows of the display elements sequentially on a row by row basis. The reference conductors 1, 2, 3 and 4 are enabling lines for selecting which of the display elements 8 of a row conductor 21 are to be connected to the shared column conductor 11. The column conductor 11 is a data line for feeding data to the selected pixel element 8 to determine the display intensity of that pixel element. Instead of an image sensor or a display, an array constructed in accordance with the present invention with scan lines 21, data lines 11 and enabling lines 1, 2, 3, 4 may be used to form a memory device or a temperature sensing device. Although FIGS. 5 and 6 illustrate the formation of the device using thin-film circuit technology, any other suitable technology may be used to fabricate the particular device required.

The row and column conductors 21 and 11 and the reference conductors 1 to 4 need not extend horizontally and vertically as shown in the drawings. Quite obviously, the row conductors 21 may extend vertically while the column conductors 11 may extend horizontally, that is the device may normally be used in an orientation which is equivalent to an arrangement as shown in FIGS. 1, 3, 5, and 7 to 9 being rotated through 900. Also, the row conductors 21, column conductors 11 and reference conductors 1 to 4 need not necessarily be perpendicular to one another, but any suitable geometry and arrangement may be used.

It should, of course, be understood that the orientations of all the diodes 8, S1 and S2 may be reversed in array arrangements such as those of FIGS. 1, 3 and 5. This, of course, requires appropriate changes in the polarity of the voltages required to drive the device. When the switching elements S1 and S2 are formed as rectifying elements, it should be understood that these rectifying elements need not be simple junction diodes. Thus, the term "rectifying element" should be understood to mean any element which has an asymmetric characteristic and which passes as low a current as possible in one direction (the reverse direction) and which passes the required current in the other direction (the forward direction).

Similarly, the photosensitive elements 8 of an image sensor need not necessarily be diodes, but they could be other types of photosensitive device which pass current when illuminated. Thus, for example, the photosensitive diodes 8 could be replaced by photoconductors, for example formed of lead oxide, each in parallel with an appropriate capacitance. The device elements 8 of an image sensor array may alternatively be formed by photosensitive transistors.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention. The applicants hereby give notice that new claims may be formulated to such features and/or combinations of such features during prosecution of the present application or of any further application derived therefrom.

I claim:

1. An electronic device comprising an array of device elements which are arranged in rows and columns and which are coupled to both row and column conductors, each row of the device elements being addressable by voltages applied to the row conductors, each device element of a row being coupled to the associated row conductor via a first switching element, the array being arranged in pairs of neighbouring columns, in each pair of which the device elements share a column conductor to which the device elements of both columns are coupled, characterized in that a device element of a row in a first column of each pair is coupled via a respective second switching element to one reference conductor, each device element of the same row in a second column of the pair is coupled via a respective further second switching element to another reference conductor, the first and second switching elements conduct when biased into an on-state by applied voltages, and the device comprises means for applying different reference voltages to the one and another reference conductors and for applying addressing voltages to the row conductors, for enabling only the switching elements associated with a selected row and with a selected column of each pair to conduct.

2. An electronic device as claimed in claim 1, further characterized in that at least some of the reference conductors extend longitudinally across the array in spaces between neighbouring column conductors such that each pair of neighbouring column conductors is separated by a respective one of the reference conductors.

3. An electronic device as claimed in claim 1, further characterized in that the array comprises device elements arranged in groups of four, each group comprises a pair of neighbouring columns which share a column conductor and a pair of neighbouring rows which share a row conductor, the four device elements of each group comprise first and second device elements of one row and third and fourth device elements of the neighbouring row in the pair, the first and second device elements are coupled via their respective second switching elements to respective first and second reference conductors, and the third and fourth device elements are coupled via their respective second switching elements to respective third and fourth reference conductors.

4. An electronic device as claimed in claim 3, further characterized in that the second and third reference conductors extend longitudinally across the array in spaces between neighbouring column conductors such that each pair of neighbouring column conductors is separated by a respective one of the second and third reference conductors, and in that the first and fourth reference conductors extend longitudinally across the array in spaces between neighbouring row conductors such that each pair of neighbouring row conductors is separated by at least one of the first and fourth reference conductors.

5. An electronic device as claimed in claim 1, further characterized in that the first and second switching elements are rectifying elements which allow the passage of current when forward-biased by applied voltages, and the device element is coupled between its shared column conductor and a node between the first and second rectifying elements.

6. An electronic device as claimed in claim 5, further characterized in that the second rectifying elements associated with all the device elements of the array have the same orientation in their coupling to the reference conductors.

7. An electronic device as claimed in claim 6, further characterized in that the first rectifying elements associated with all the device elements of the array have the same orientation in their coupling to the row conductors.

8. An electronic device as claimed in claim 5, further characterized in that the rectifying elements comprise thin-film diodes.

9. An electronic device as claimed in claim 1, further characterized in that the first and second switching elements comprise thin-film transistors, the device element is coupled to its shared column conductor by both the first and second transistors, the associated row conductor is coupled to a gate of the first transistor, and the reference conductor is coupled to a gate of the second transistor.

10. An electronic device as claimed in claim 1, further characterized in that all the device elements of the array have the same orientation in their coupling to the shared column conductors.

11. An electronic device as claimed claim 1, further characterized in that the device elements each comprise a photosensitive element for storing charge in response to light incident on the photosensitive element, in one mode of operation.

* * * * *